US010672608B2

(12) United States Patent
Lee et al.

(10) Patent No.: US 10,672,608 B2
(45) Date of Patent: Jun. 2, 2020

(54) FABRICATION OF A DEVICE ON A CARRIER SUBSTRATE (71) Applicants: Massachusetts Institute of Technology, Cambridge, MA (US); National University of Singapore, Singapore (SG); Nanyang Technological University, Singapore (SG)

(72) Inventors: Kwang Hong Lee, Singapore (SG); Li Zhang, Singapore (SG); Soo Jin Chua, Singapore (SG); Eng Kian Kenneth Lee, Singapore (SG); Eugene A. Fitzgerald, Cambridge, MA (US); Chuan Seng Tan, Singapore (SG)

(73) Assignees: Massachusetts Institute of Technology, Cambridge, MA (US); National University of Singapore, Singapore (SG); Nanyang Technological University, Singapore (SG)

( * ) Notice: Subject to any disclaimer, the term of this patent is extended or adjusted under 35 U.S.C. 154(b) by 0 days.

(21) Appl. No.: 16/071,684

(22) PCT Filed: Jan. 20, 2017

(86) PCT No.: PCT/SG2017/050032
§ 371 (c)(1),
(2) Date: Jul. 20, 2018

(87) PCT Pub. No.: WO2017/127026
PCT Pub. Date: Jul. 27, 2017

(65) Prior Publication Data
US 2019/0051516 A1 Feb. 14, 2019

Related U.S. Application Data (63) Continuation of application No. 62/280,861, filed on Jan. 20, 2016.

(51) Int. Cl.
*H01L 21/02* (2006.01)

(52) U.S. Cl.
CPC ...... *H01L 21/0254* (2013.01); *H01L 21/0251* (2013.01); *H01L 21/02381* (2013.01);
(Continued)

(58) Field of Classification Search
CPC ............ H01L 21/0254; H01L 21/0251; H01L 21/02381; H01L 21/02458; H01L 21/02433; H01L 21/02505
See application file for complete search history.

(56) References Cited

U.S. PATENT DOCUMENTS 5,453,394 A * 9/1995 Yonehara .......... H01L 21/30604
148/DIG. 12
2002/0168864 A1 11/2002 Cheng et al.
(Continued)

FOREIGN PATENT DOCUMENTS

GB 2485418 A 5/2012
WO 2016007088 A1 1/2016

OTHER PUBLICATIONS

Chung, J.W. et al. "GaN-on-Si Technology, a New Approach for Advanced Devices in Energy and Communications," Proceedings of the European Solid-State Device Research Conference 2010 (ESSDERC); 52-56. 2010 IEEE.
(Continued)

*Primary Examiner* — Kyoung Lee
(74) *Attorney, Agent, or Firm* — Michael Best & Friedrich LLP (57) ABSTRACT A method of fabricating a device on a carrier substrate, and a device on a carrier substrate. The method comprises providing a first substrate; forming one or more device layers on the first substrate; bonding a second substrate to
(Continued)

the device layers on a side thereof opposite to the first substrate; and removing the first substrate.

17 Claims, 6 Drawing Sheets

(52) U.S. Cl.
CPC .. *H01L 21/02433* (2013.01); *H01L 21/02458* (2013.01); *H01L 21/02505* (2013.01)

(56) References Cited

U.S. PATENT DOCUMENTS

| | | | |
|---|---|---|---|
| 2003/0087503 A1* | 5/2003 | Sakaguchi | H01L 21/3221 438/406 |
| 2008/0217645 A1 | 9/2008 | Saxler et al. | |
| 2010/0127353 A1* | 5/2010 | Letertre | H01L 21/0242 257/615 |
| 2014/0284609 A1 | 9/2014 | Vielemeyer | |

OTHER PUBLICATIONS

International Search Report and Written Opinion of the International Searching Authority, Appl. No. PCT/SG2017/050032, dated Feb. 23, 2017.

European Patent Office Extended Search Report for Application No. 17741745.8 dated Aug. 13, 2019 (10 pages).

\* cited by examiner

FABRICATION OF A DEVICE ON A CARRIER SUBSTRATE

FIELD OF INVENTION

The present invention relates broadly to a method of fabricating a device on a carrier substrate, and to a device on a carrier substrate.

BACKGROUND

For the growth of III-N materials (i.e. GaN, AlN and InN and their alloys) on 50, 100, 150, 200 mm, or even larger Si substrates, it is often discovered that although the tensile strain due to thermal mismatch is carefully compensated by a strain engineered buffer, the wafer is fragile during further process handling. The fragility manifests itself e.g. in the GaN-on-Si wafers breaking into large pieces with fairly high frequency during steps involving thermal processing (e.g. anneals, high temperature film deposition/etching etc.) and mechanical handling (e.g. chemo-mechanical polishing, wafer bonding etc.).

For example, it was noticed that the fragility of 200 mm diameter 725 μm thick GaN-on-Si wafers was caused primarily by the formation of slip-lines in the Si substrate during the substrate annealing step e.g. before the Low Temperature (LT)-AlN deposition. This is believed to be due to the presence of vertical and radial temperature variations across the 200 mm Si substrate. The Si crystal slip takes place if the local stress exceeds the yield strength at the annealing temperature (1050° C.) prior to the LT-AlN growth. There are two possible major sources of stress on the Si substrate in MOCVD growth. They are the contact stresses between the wafer and the point at which it contacts the susceptor, and the thermal stress due to temperature non-uniformity in the vertical and radial directions across the wafer. The slip lines originate from the edge of the wafer and propagate toward the center of the wafer. Minimizing radial temperature differences across the 200 mm Si wafer during growth through the optimization of heater zone settings is one key way to reduce slip formation and wafer fragility, but it is not possible to fully eliminate vertical temperature differences through the wafer due to heat only being supplied to the back-side of the wafer. Thus, in almost all cases, wafer fragility remains an issue due to the high growth temperatures involved in III-nitride on Si epitaxy.

Embodiments of the present invention seek to address at least one of the above problems.

SUMMARY

In accordance with a first aspect of the present invention, there is provided a method of fabricating a device on a carrier substrate, the method comprising providing a first substrate; forming one or more device layers on the first substrate; bonding a second substrate to the device layers on a side thereof opposite to the first substrate; and removing the first substrate.

In accordance with a second aspect of the present invention, there is provided a device comprising a carrier substrate; and one or more device layers on the carrier substrate; wherein the device layers were grown on a substrate different from the carrier substrate.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

In example embodiments of graded AlGaN layers, for example 3 graded AlGaN layers with Al content of 80%, 50% and 20% (starting from e.g. a Si (111) substrate), were grown on top of a AlN/Si structure at a temperature of 1050° C. Example embodiments use a strain compensation method in GaN-on-Si heteroepitaxy. The basic idea is to introduce compressive strain during epitaxial growth by employing the in-plane lattice mismatch in the AlGaN material system to compensate for the large tensile strain due to thermal mismatch generated during cooling from growth temperature to room temperature. The stress evolution of step-graded AlGaN is discussed in detail based on the basic strain engineering principle. While the difficulty in strain engineering on a 725 μm thick 200 mm diameter Si wafer can be reduced by employing a shaped susceptor that decouples the change in thermal conduction from wafer curvature change, example embodiments of the present invention apply $Al_{0.2}Ga_{0.8}N$ layer thickness adjustment and preferably $SiN_x$ in situ masking to tune the final bow of the GaN-on-Si wafers. Usually, a more convex wafer is produced from an increase in $Al_{0.2}Ga_{0.8}N$ layer thickness and Threading Dislocation Density (TDD), in general, improves as well. However, the composition of screw and edge Threading Dislocation (TD) changes with $Al_{0.2}Ga_{0.8}N$ layer thickness. Usually, 1.2 μm of GaN can be deposited with a $SiN_x$ in situ masking layer inserted after 80 nm of GaN at 1000° C. In the case of $SiN_x$ in situ masking, it decouples the compressive strain of the GaN from the $Al_{0.2}Ga_{0.8}N$ layer, so the GaN layer is less compressive. TDD monotonically improves with the coverage of $SiN_x$. In preferred embodiments, $Al_{0.2}Ga_{0.8}N$ layer thickness and $SiN_x$ in situ masking duration are combined to advantageously produce a bow-free wafer with minimum TDD on 725 μm thick 200 mm diameter Si wafers.

It is noted that in various embodiments the other e.g. 50% and 80% Al content AlGaN buffer layers can advantageously also help in the strain engineering. However, it is expected that in the step-graded buffer system according to example embodiments, it is the layers with lowest e.g. Al content (i.e. 20% Al and 0% Al=GaN) that adds the most compressive strain to the system, and thus has the greatest effect on bow control.

Example embodiments of the present invention provide a method to replace the initial substrate, e.g. Si (111), that contains slips with a new, slip-free substrate, e.g. a Si (100) substrate. Through this method, the thick buffer layers that may have been used for strain engineering can also be removed and a thin device layer structure on Si can be realized even when buffer layers are used for strain engineering. In addition, the stress of e.g. GaN can be manipulated by adjusting the final GaN thickness. Additionally or alternatively, the Si (100) substrate can also have the advantage of being accepted and processed in commercial CMOS foundries easily.

Figure 1:
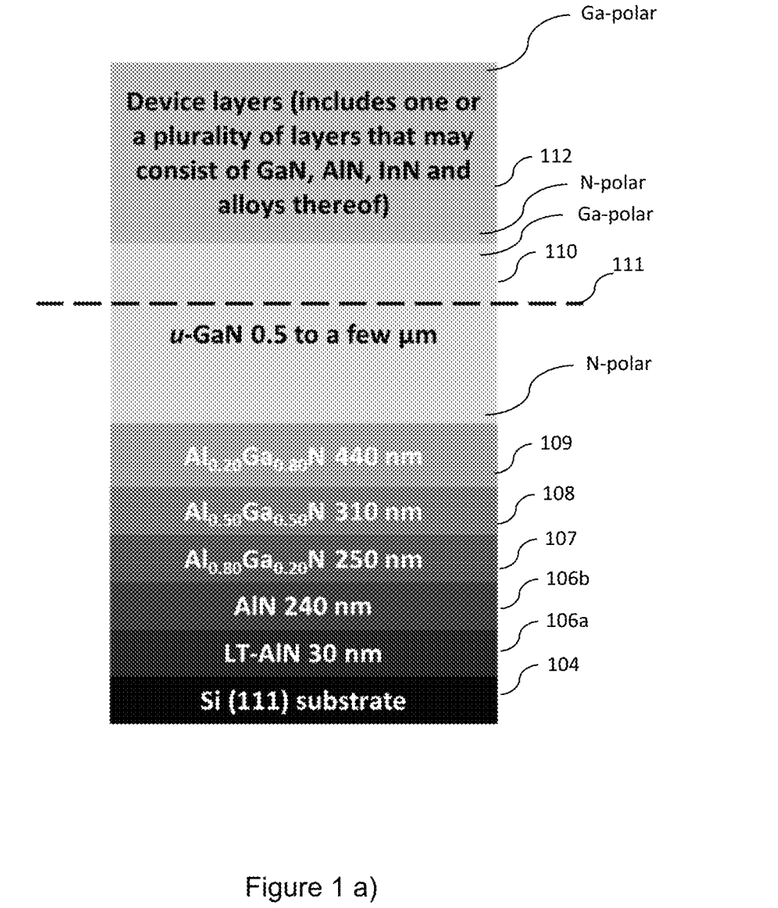
FIG. 1 shows the steps of Si(111) substrate replacement for GaN/Si, according to an example embodiment.

FIGS. 1 $a$) and $b$) show a sequence of steps for substrate replacement according to an example embodiment. In this embodiment, the graded layer approach for strain management discussed above has been used, however, different strain engineering methods may be applied in the formation of a starting GaN on Si (111) substrate, containing e.g. one or more GaN device layers, in different embodiments.

As shown in FIG. 1 $a$), prior to the actual epitaxial growth, a Si (111) substrate 104 was first in situ annealed to remove native oxide. Then, a 20 nm low-temperature (LT) AlN nucleation layer 106$a$ was grown at 980° C. The temperature was increased to grow a high-temperature (HT)-AlN layer 106$b$, with AlN precursor flow being maintained during the temperature ramping (10 nm of AlN deposition took place during the temperature ramping). After 210 nm AlN (106$a$/$b$) growth, step-graded $Al_xGa_{1-x}N$ layers (250 nm 80% Al layer 107, 310 nm 40% Al layer 108 and 440 nm 20% Al layer 109) are grown to introduce compressive strain to compensate the tensile strain built up in the subsequent grown GaN layers when the wafer is cooled down after growth. Usually, the growth of 0.5 to a few µm u-GaN layer 110 with $SiN_x$ masking layer 111 is carried out before the growth of the device layer(s) 112.

It is noted that in this example embodiment, the epitaxy is Ga-polar/metal-polar, which is the more typical case as will be appreciated by a person skilled in the art. However, N-polar epitaxy is possible in different embodiments. The terms "N-polar" and "Ga-polar/metal-polar" refer to the atomic arrangement at the top (accessible) surface of the wafer, and the polarity/arrangement is generally preserved throughout the various material layers. With reference to FIG. 1 $a$) the polarity of the top (accessible) surface of the GaN device layer(s) 112 is Ga-polar in this embodiment, and thus the wafer is considered to have a Ga-polar surface, and correspondingly the bottom of the GaN device layer(s) 112 will have an N-polarity. As the polarity is preserved across each layer, it should be noted that the top of the adjacent GaN layer 110 will have a Ga-polar surface again, while the bottom of the GaN layer 110 will have an N-polarity. The converse is true for all the polarities for a starting/growth wafer with an N-polar surface in different embodiments.

With reference to step 1 of FIG. 1$b$, in this example embodiment, $SiO_2$ 102 was then deposited on the wafer 103 (i.e. the Si (111) substrate 104, the AlN layer 106$a$/$b$, 3 graded AlGaN buffer layers 107-109 with Al content of 80%, 50% and 20% respectively, GaN layer 110 with $SiN_x$ masking (not shown), which may be considered a buffer layer in example embodiments, followed by the GaN device layer(s) 112) and then densified at high temperature (e.g. ~600° C., several hrs) under $N_2$ ambient. The $SiO_2$ layer 102 can be replaced by $Si_3N_4$, $Al_2O_3$, AlN (aluminum nitride), BN (boron nitride) and other dielectrics in different embodiments (as well as a combination of different dielectrics, e.g. $SiO_2+Si_3N_4$) to improve the thermal conductivity as well as bonding strength. To achieve a successful fusion bonding, the RMS roughness of the wafer surface is preferably <1 nm. Hence, the wafer 103, after dielectric deposition, was polished using Chemical Mechanical Polishing (CMP) followed by RCA clean in example embodiments. Another Si (100) substrate/wafer 114 was used and served as a donor wafer.

Prior to bonding, both wafers (i.e. wafer 103, after dielectric deposition, and Si (100) substrate 114) were subjected to plasma exposure (e.g. $O_2$, $N_2$, $H_2$, Ar, etc) for several seconds, rinsed with deionized water and then spin-dried in example embodiments. Plasma exposure can increase the surface hydrophilicity of the dielectric (e.g. $SiO_2$ layer 102). The rinsing step terminates the wafers' surfaces with hydroxyl (OH) groups at a sufficiently high density to initiate wafer bonding. After bonding, which is based on van-der-Waals forces between the hydrogen atoms in this example embodiment, the wafer pair 103/114 was annealed at 300° C. in an atmospheric $N_2$ ambient for 3 hrs to further enhance the bond strength. It is noted that the bonding can be done with any reasonable Si (111) wafer's 103 starting bow value, e.g. absolute bow <150 µm, with the final wafer bow being advantageously optimized as described in more detail below, and in general a final wafer bow <50 µm is desirable to improve the yield of subsequent fabrication processing.

With reference to step 2 of FIG. 1$b$, grinding of the Si (111) 104 (to 50 µm in this example embodiment) was performed. After that, a protective layer from Brewer Science 116 (which is able to survive in acidic environment) was deposited, e.g. spin coated, on the backside of the Si (100) 112 donor wafer to act as a protection layer during the Si removal process from the Si (111) 104 substrate. The remaining Si (111) is removed in this example embodiment by submerging the wafer bonded pair into the HNA solution (e.g. HF:Nitric acid:Acetic acid=1:1.5:3.75 in volume, noting that the ratio can be changed to achieve different etching rates as desired). The AlN 106 was used as an etch-stop layer in this example embodiment, since the etching selectivity of AlN over Si is high in the HNA solution used. The etching was carried out at room temperature and until the Si was completely removed, which can be determined by noting when effervescence within the etchant ceases. The protective layer was removed by acetone resulting in the structure as shown in step 3 of FIG. 1.

Optionally, the AlN 106, the 3 AlGaN buffers 107-109, and the GaN layer can then be removed, e.g. by inductive coupled plasma reactive ion etching (ICP-RIE) or CMP process. It is noted that while typically at the end of the entire process, the minimal set of layers needed to remain is the device layer(s) 112. However, some or none of the buffer layers might be desired, e.g. due to the bow/strain requirements. A GaN device layer 112 with an N-polar surface can thus be obtained, as shown in step 4 of FIG. 1$b$). This is because the wafer has been vertically inverted in the intervening step 2, so what used to be the Ga-polar top (accessible) surface of GaN device layer 112 in step 1 is now (in step 4) the bottom layer (bonded to the SiO2 layer 102), and thus the new top (accessible) surface is the previous N-polar surface of GaN device layer 112 that was adjacent to GaN layer 110 (in step 1). To achieve good process yield, it may be preferred to have an appropriate etch-stop layer (not shown) in such embodiment so that the ICP-RIE or CMP process in step 4 ends at the proper depth to result in the desired N-polar surface.

To realize a GaN layer 112 with a Ga-polar surface from step 4 in a continuation of the process of this example embodiment, a $SiO_2$ layer (or other dielectric or a combination of dielectrics) 117 was deposited on the wafer of step 4 in FIG. 1b and then densified. CMP process was carried out to smoothen the $SiO_2$ film 117 to achieve a successful bonding. After the CMP process, the wafer was RCA cleaned and bonded to another Si (100) handle substrate 118, as shown in step 5 of FIG. 1. The bonding process was similar to the one described above with reference to step 1 of FIG. 1b). After the bonding, the same grinding as described above for the removal of the Si (111) substrate 104 with reference to step 2, and tetramethylammonium hydroxide (TMAH) etching is used for the removal of the Si (100) substrate 114, resulting in the wafer depicted in step 6 of FIG. 1b), with a GaN layer(s) 112 with a Ga-polar surface.

It is again noted that if a Ga-polar surface is desired at the end of the etching in step 4, without the $2^{nd}$ bonding step described above, a way to do it would be to grow an inverted device epi-structure (compare FIG. 1 a)) with an N-polar top (accessible) surface of the GaN device layer 112, according to a different embodiment, instead of the Ga-polar top (accessible) surface of GaN device layer 112. This effectively inverts the polarity of the exposed (layer 112 in step 4) GaN surface to be Ga-polar at that point, thereby removing the need for steps 5 ($2^{nd}$ bonding step) and 6 for obtaining the Ga-polar device layer in such an embodiment. To achieve good process yield, it may again be preferred to have an appropriate etch-stop layer in such embodiment so that the ICP-RIE or CMP process in step 4 ends at the proper depth to result in the desired Ga-polar surface.

Figure 2:
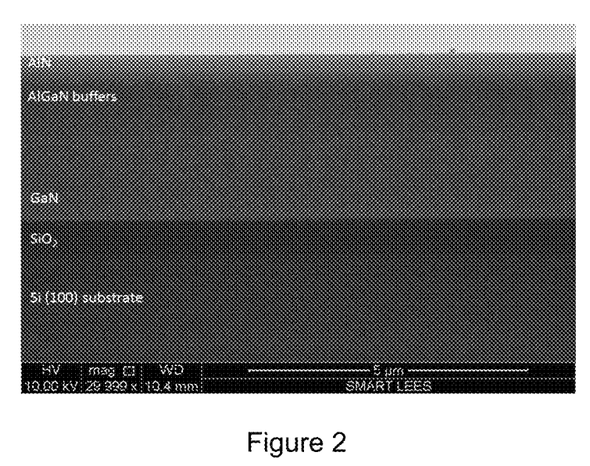
FIG. 2 shows a cross-sectional SEM image of the GaN and its buffer layers on Si (100) substrate after the 1$^{st}$ bonding and Si (111) removal of FIG. 1.

FIG. 2 shows a cross-sectional Scanning Electron Microscopy (SEM) image of the structure of step 3 in FIG. 1, i.e. after the 1st bonding and Si (111) substrate 104 removal.

Figure 3:
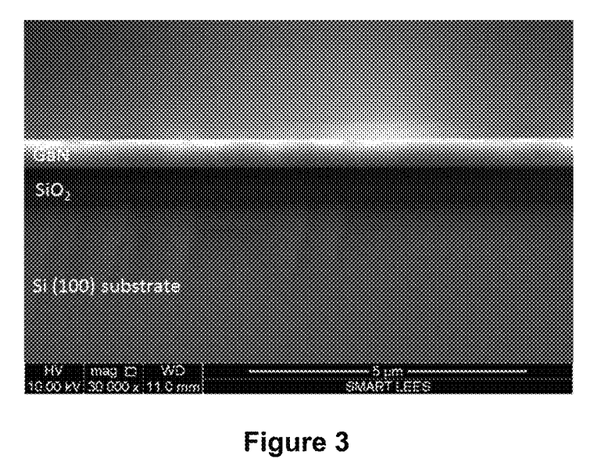
FIG. 3 shows a cross-sectional SEM image of the GaN-on-insulator (GaN-OI) after the AlN, AlGaN buffers and part of the GaN are removed, according to an example embodiment.

FIG. 3 shows a cross-sectional SEM image of the structure of step 4 in FIG. 1, i.e. after the removal of AlN 106, AlGaN buffers 107-109, GaN layer 110 and parts of GaN layer(s) 112 through ICP-RIE.

Figure 4:
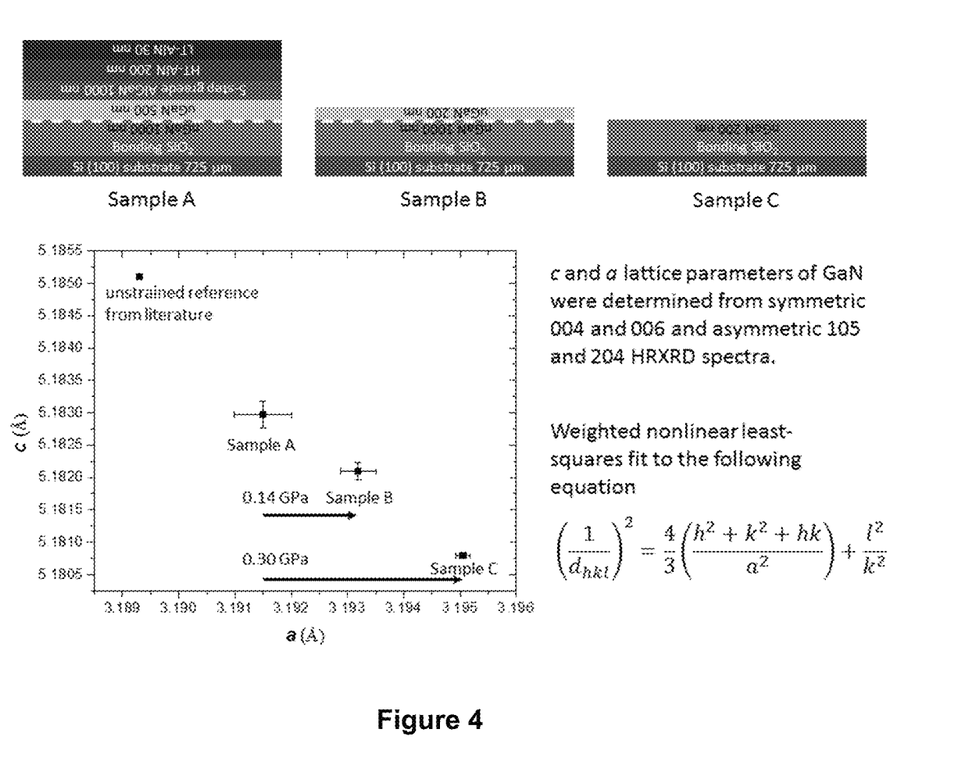
FIG. 4 shows experimental results of the analysis of the lattice constant of the GaN for a 5 graded AlGaN layers strain engineered example embodiment, at different steps of buffer layer/GaN removal.

FIG. 4 shows experimental results of the analysis of the lattice constant of the GaN for a 5 graded AlGaN layers strain engineered example embodiment, at different steps of buffer layer/GaN removal, i.e. with different "top" layers exposed to the ambient around the wafer.

As can be seen from the results shown in FIG. 4, by controlling the final GaN thickness (compare $t_B$ and $t_C$ for samples B and C respectively), the stress of the GaN can be manipulated from 0.14 GPa to 0.3 GPa and even higher tensile stress is achievable with a much thinner GaN. Highly tensile strain GaN layer(s) may e.g. be desired to increase the electron mobility and hence improve the performance of High-Electron-Mobility Transistors (HEMTs). Advantageously, since the fragile Si(111) substrate was replaced by the Si(100) donor substrate in example embodiments, the high tensile strain of the GaN layer(s) does not cause breaking of the wafer.

Figure 5:
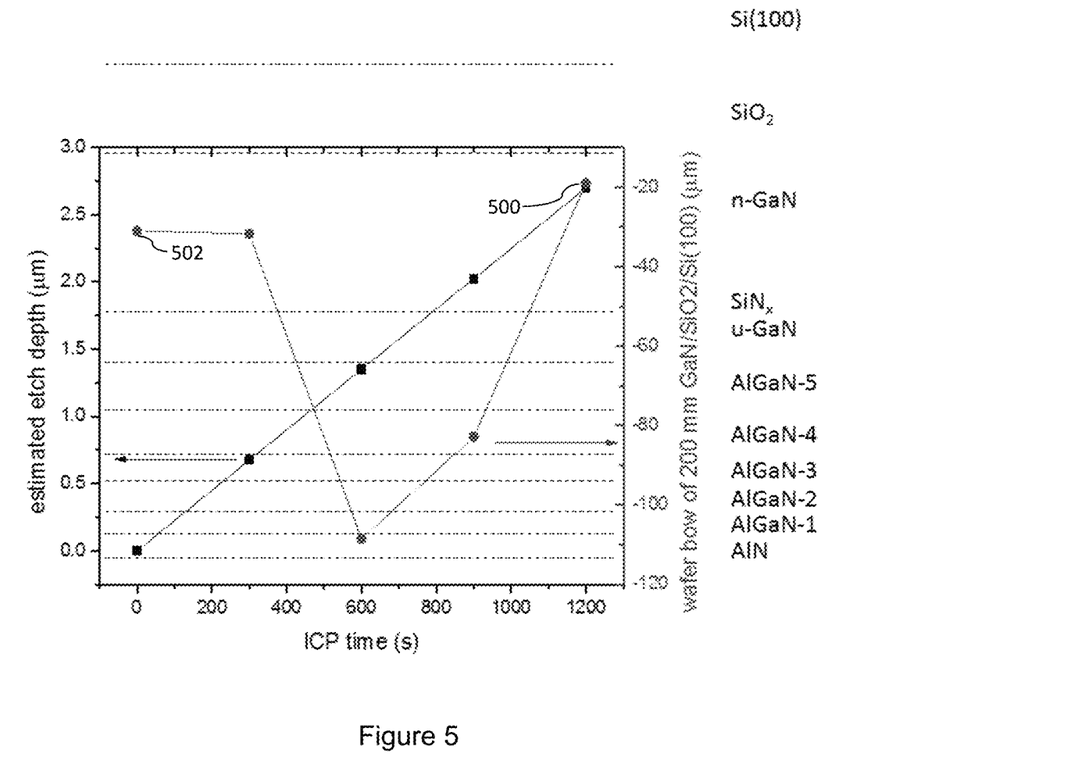
FIG. 5 shows experimental results of the analysis of wafer bow for the 5 graded AlGaN layers strain engineered example embodiment, at different steps of buffer layer/GaN removal.

FIG. 5 shows experimental results of the analysis of wafer bow for the 5 graded AlGaN layers strain engineered example embodiment, at different steps of buffer layer/GaN removal. As can be seen from FIG. 5, the final wafer bow (−20 μm, compare numeral 500) after removing the AlN, AlGaN buffers, u-GaN and parts of n-GaN layers is getting smaller compared to the wafer bow (−30 μm, compare numeral 502) with all layers, including the buffer layers, present. It is noted that the n-GaN layers as indicated in FIG. 5 include the device layer(s), and that even part of the device layer(s) may be removed, such as undesired parts of the device layer(s). As can be seen from FIG. 5, bow of the initial GaN/buffers/Si (compare sample A in FIG. 4) is −30 um, the bow is increased to −110 um after removal of AlN buffer layer, and the bow is reduced to −85 um after removal of AlN+AlGaN1+AlGaN2+AlGaN 3 buffers. Finally, the bow of the GaN/SiO2/Si (compare sample C in FIG. 4) is reduced to −20 um after all the buffer layers are removed.

Figure 6:
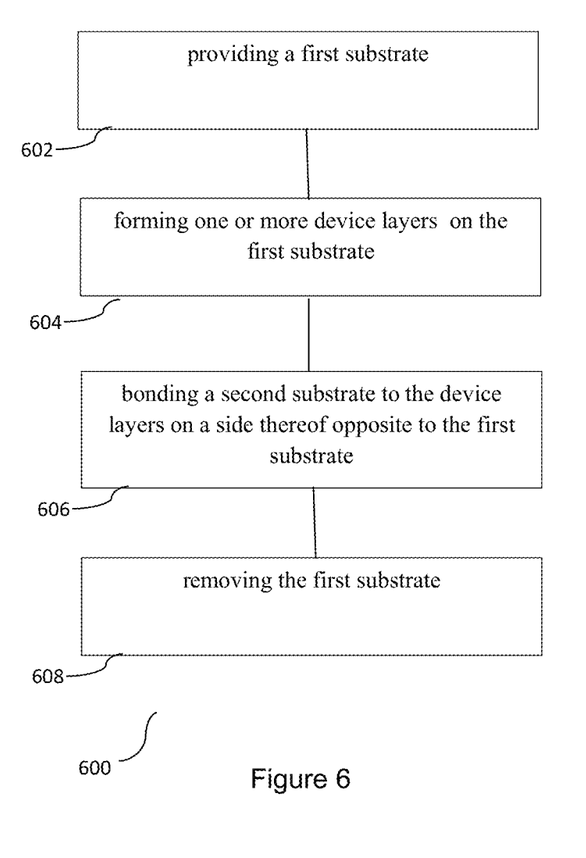
FIG. 6 shows a flow chart illustrating a method of fabricating a device on a carrier substrate, according to an example embodiment.

FIG. 6 shows a flow chart 600 illustrating a method of fabricating a device on a carrier substrate, according to an example embodiment. At step 602, a first substrate is provided. At step 604, one or more device layers are formed on the first substrate. At step 606, a second substrate is bonded to the device layers on a side thereof opposite to the first substrate. At step 608 the first substrate is removed.

A polarity of the device layers may be inverted as a result of the bonding to the second substrate and the removing of the first substrate.

Forming the device layers may comprise forming a plurality of buffer layers with different compositions prior to forming the device layers on the plurality of buffer layers. Forming the buffer layers may comprise $SiN_x$ masking. The plurality of buffer layers and/or the device layers may be grown by epitaxial growth. The method may further comprise removing at least a portion of the buffer layers. The method may further comprise removing a portion of the device layers. The method may further comprise providing an etch-stop layer and using the etch-stop layer to achieve a desired polarity of the device layers with high yield.

The method may further comprise bonding a third substrate to at least a portion of the device layers on a side thereof opposite to the second substrate, and removing the second substrate. The polarity of the device layers may be inverted as a result of the bonding to the third substrate and the removing of the second substrate. The method may further comprise providing another etch-stop layer and using the other etch-stop layer to achieve a desired polarity of the device layers with high yield.

In one embodiment, a device comprises a carrier substrate; and one or more device layers on the carrier substrate; wherein the device layers were grown on a substrate different from the carrier substrate.

A polarity of the device layers on the carrier substrate may be inverted compared to a polarity of the device layers on the different substrate.

A polarity of the device layers on the carrier substrate may be the same as a polarity of the device layers on the different substrate.

The device may further comprise at least a portion of a buffer layer used during the growth of the device layers on a side of thereof opposite to the carrier substrate. The device may comprise one or more buffer layers with different compositions used during the growth of the device layers on a side of thereof opposite to the carrier substrate. The buffer layers may comprise a $SiN_x$ mask. The device layers or the portion of the buffer layer or one of the one or more buffer layers may be exposed to an ambient. The device layers and/or the portion of the buffer layer and/or the one or more buffer layers may have been grown by epitaxial growth.

Embodiments of the present invention can have one or more of the following characteristics/advantages:

(i) graded layers, e.g. 3 step graded AlGaN layers with Al content of 80%, 50% and 20%, are grown to introduce compressive strain during epitaxial growth. Although 3-step graded and 5 step graded AlGaN layers are elucidated as examples in the above description, other numbers of graded layer are also possible, typically about 1-10 numbers of graded layers. This is advantageous as tensile strain will be introduced during cooldown from the growth temperature to room temperature at the end of the growth process. Hence, both the compressive and tensile strain will preferably compensate each other and results to a minimum change of the wafer bow. For subsequent processing, such as wafer bonding, lithography, etc. tailoring the step-grading profile (i.e. number of steps, thickness of each step, alloy composition of each step) can preferably be performed, noting that depending on the final device heterostructure and thickness, the optimum stress profile desired within the buffer layers can vary significantly.

(ii) $SiN_x$ in-situ mask is used to decouple the compressive strain and make the GaN layer relatively less compressively-strained after the $SiN_x$ in-situ mask.

(iii) The fragile Si (111) substrate is replaced by a Si (100) wafer.

(iv) The stress of GaN and final device layers can also be manipulated by controlling the final GaN thickness. Highly tensile strained GaN layer(s) can e.g. increase the electron mobility and hence improve HEMT's performance.

(v) Thin device (HEMT or LED) layers are achievable by removing the thick buffer layers for a better device's performance (better heat dissipation, e.g. in HEMT or Light Emitting Diode (LED) devices).

(vi) N-polar GaN or Ga-polar GaN can be obtained.

(vii) The Si (100) wafer is easier to be accepted and processed by foundries compared to Si (111) substrates.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive. Also, the invention includes any combination of features, in particular any combination of features in the patent claims, even if the feature or combination of features is not explicitly specified in the patent claims or the present embodiments.

For example, in different embodiments the present invention can be applicable to other device layer(s), including to other semiconductor material systems. For example, the tensile thermal mismatch in heteroepitaxial InGaP (e.g. for a light emitting device (LED)) on Si with Ge and GaAs buffer cause the wafer to have a large concave bow. In such embodiments, the method to replace the original Si substrate and remove the Ge and GaAs buffer can also be applied to improve wafer stability.

Also, while the use of a graded structure for strain engineering/control has been described in the example embodiments herein, and the present invention can be applied to wafers with different types of strain engineering (e.g. superlattice buffers etc.) in different embodiments.

The invention claimed is:

1. A method of fabricating a device on a carrier substrate, the method comprising:
   providing a first substrate;
   forming a plurality of buffer layers with different compositions by epitaxial growth on the first substrate;
   forming one or more device layers on the plurality of buffer layers;
   bonding a second substrate to the device layers on a side thereof opposite to the first substrate;
   removing the first substrate; and
   adjusting strain in the one or more device layers by removing at least a portion of the buffer layers to reduce a thickness of the buffer layers.

2. The method of claim 1, wherein a polarity of the device layers is inverted as a result of the bonding to the second substrate and the removing of the first substrate.

3. The method of claim 1, wherein forming the buffer layers comprises SiNx masking.

4. The method of claim 1, wherein all buffer layers are removed.

5. The method of claim 4, further comprising removing a portion of the device layers to reduce a thickness of the device layers.

6. The method of claim 1, further comprising providing an etch-stop layer and using the etch-stop layer to achieve a desired polarity of the device layers with high yield.

7. The method of claim 1, further comprising bonding a third substrate to the one or more device layers on a side thereof opposite to the second substrate, and removing the second substrate.

8. The method of claim 7, wherein the polarity of the device layers is inverted as a result of the bonding to the third substrate and the removing of the second substrate.

9. The method of claim 7, further comprising providing another etch-stop layer and using the other etch-stop layer to achieve a desired polarity of the device layers with high yield.

10. A device comprising:
    a carrier substrate; and
    one or more device layers on the carrier substrate;
    wherein the one or more device layers were grown on a plurality of epitaxially grown buffer layers with different compositions on a substrate different from the carrier substrate; and
    wherein a strain in the one or more device layers was adjusted by removing at least a portion of the buffer layers to reduce a thickness of the buffer layers.

11. The device of claim 10, wherein a polarity of the device layers on the carrier substrate is inverted compared to a polarity of the device layers on the substrate.

12. The device of claim 10, wherein a polarity of the device layers on the carrier substrate is the same as a polarity of the device layers on the substrate.

13. The device of claim 10, further comprising at least one of the buffer layers used during the growth of the device layers on a side thereof opposite to the carrier substrate.

14. The device of claim 13, comprising a plurality of buffer layers with different compositions used during the growth of the device layers on a side thereof opposite to the carrier substrate.

15. The device of claim 13, wherein the plurality of buffer layers comprise a SiNx mask.

16. The device of claim 13, wherein the device layers or at least one buffer layer are exposed to an ambient.

17. The device of claim 13, wherein the device layers were grown by epitaxial growth.

* * * * *